(12) United States Patent
Lim

(10) Patent No.: US 8,093,132 B2
(45) Date of Patent: Jan. 10, 2012

(54) METHOD OF MANUFACTURING A BIPOLAR JUNCTION TRANSISTOR

(75) Inventor: Hyon Chol Lim, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 75 days.

(21) Appl. No.: 12/642,221

(22) Filed: Dec. 18, 2009

(65) Prior Publication Data

US 2010/0163872 A1    Jul. 1, 2010

(30) Foreign Application Priority Data

Dec. 31, 2008    (KR) .................. 10-2008-0138103

(51) Int. Cl.
*H01L 21/331* (2006.01)
*H01L 29/66* (2006.01)

(52) U.S. Cl. ..................... 438/349; 257/592

(58) Field of Classification Search ............... 257/571, 257/586, 591–592, E27.017–E27.109; 438/343–350
See application file for complete search history.

(56) References Cited

U.S. PATENT DOCUMENTS

2007/0052015 A1* 3/2007 Miura et al. ............... 257/331
2008/0116512 A1* 5/2008 Kawaguchi et al. ........ 257/334
* cited by examiner

*Primary Examiner* — Calvin Lee
(74) *Attorney, Agent, or Firm* — The Law Offices of Andrew D. Fortney; Andrew D. Fortney

(57) ABSTRACT

A bipolar junction transistor and a method of manufacturing a bipolar junction transistor are disclosed. An exemplary bipolar junction transistor includes a second conductivity type base region in a first conductivity type substrate, step-shaped recesses in the base region, a polysilicon layer doped with a first conductivity type impurity in the step-shaped recesses, and a step-shaped emitter region between the polysilicon layer and the base region.

19 Claims, 6 Drawing Sheets

METHOD OF MANUFACTURING A BIPOLAR JUNCTION TRANSISTOR

CROSS REFERENCE TO RELATED APPLICATION

This application claims the benefit of Korean Patent Application No. 10-2008-0138103, filed on Dec. 31, 2008, which is hereby incorporated by reference as if fully set forth herein.

BACKGROUND OF THE DISCLOSURE

1. Field of the Disclosure

The present invention relates to a semiconductor device, more particularly, to a bipolar junction transistor (BJT) and a method of manufacturing the same.

2. Discussion of the Related Art

Generally, poly-emitter type bipolar junction transistors are suitable for high speed operation and they are operable in a high frequency range. Generally, a collector current increases in proportion to a reverse saturation current in a normal active mode of such a bipolar junction transistor (BJT).

FIG. 1 is an overhead or layout view illustrating a conventional poly-emitter type bipolar transistor. FIG. 2 is a cross-sectional view of the bipolar junction transistor shown in FIG. 1 along the A-A' line.

The reverse saturation current in the BJT is determined by a predetermined number of elements. In order to increase current gain while maintaining a base voltage and an emitter voltage that are identical to each other, the reverse saturation current can be increased.

To increase the reverse saturation current, the functional area of the emitter 130, base 120, and collector 110 may each be increased, or the depth of the base 120 may be decreased. However, when the depth of the base is decreased, the depletion layers of the emitter 130 and the collector may be too close and may overlap. Thus, the device characteristics may deteriorate.

SUMMARY OF THE DISCLOSURE

Accordingly, the present invention is directed to a poly-emitter type bipolar junction transistor and a method of manufacturing the same.

An object of the present invention is to provide a poly-emitter type bipolar junction transistor with an increased current gain.

Additional advantages, objects, and features of the disclosure will be set forth in part in the description which follows and in part will become apparent to those skilled in the art upon examination of the following or may be learned from practice of the invention. The objectives and other advantages of the invention may be realized and attained by the structure(s) particularly pointed out in the written description and claims hereof as well as the appended drawings.

To achieve these objects and other advantages and in accordance with the purpose(s) of the invention, as embodied and broadly described herein, a bipolar junction transistor can include a second conductivity type base region in a first conductivity type substrate; step-shaped recesses in the base region; a polysilicon layer in the step-shaped recesses, the polysilicon doped with a first conductivity type impurity; and a step-shaped emitter region between the polysilicon layer and the base region.

In another aspect of the present invention, a method of manufacturing a bipolar junction transistor can include forming a second conductivity type base region by implanting a second conductivity type impurity into a first conductivity type substrate; forming step-shaped recesses by etching the substrate in the base region; depositing a polysilicon layer doped with a first conductivity type impurity on the substrate and in the step-shaped recesses; and forming a step-shaped emitter adjacent to the polysilicon layer by diffusing the first conductivity type impurity from the polysilicon layer into the substrate.

According to the present invention, a contact area of a junction region between the emitter and the base can be increased. As a result, a reverse saturation current and a current gain may increase and a current gain may increase. In addition, an extended base can be formed in order to maintain a uniform distance between the emitter and the collector. As a result, a breakdown voltage may be adjusted uniformly.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle(s) of the disclosure. In the drawings.

DESCRIPTION OF SPECIFIC EMBODIMENTS

Reference will now be made in detail to specific embodiments of the present invention, examples of which are illustrated in the accompanying drawings. Wherever possible, the same reference numbers will be used throughout the drawings to refer to the same or like parts.

Figure 1:
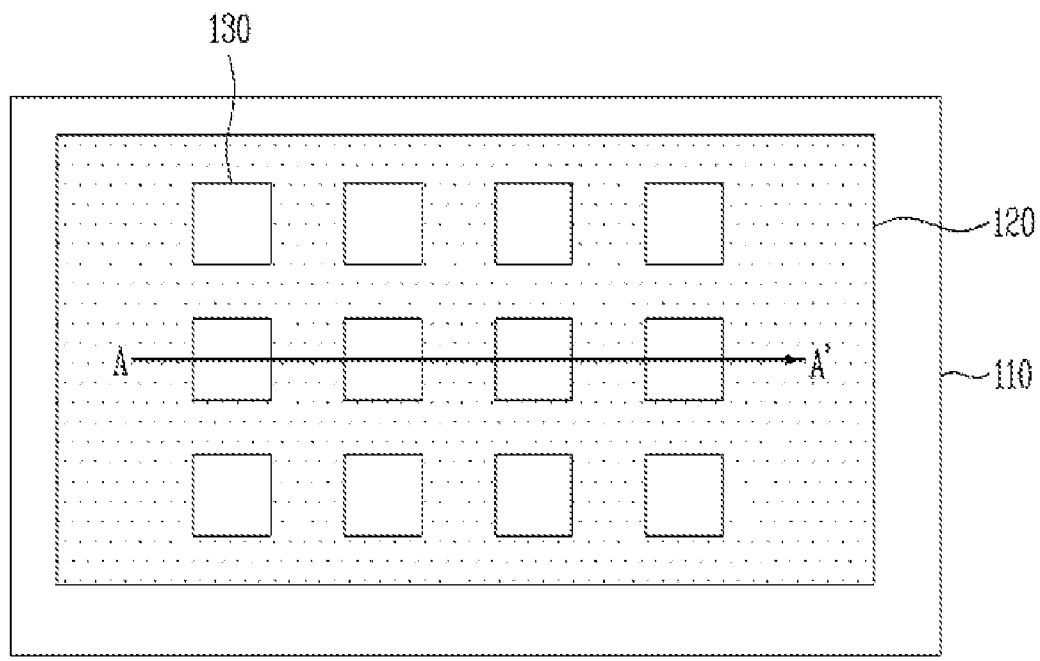
FIG. 1 is an overhead or layout view of a conventional poly-emitter type bipolar junction transistor.
Figure 2:
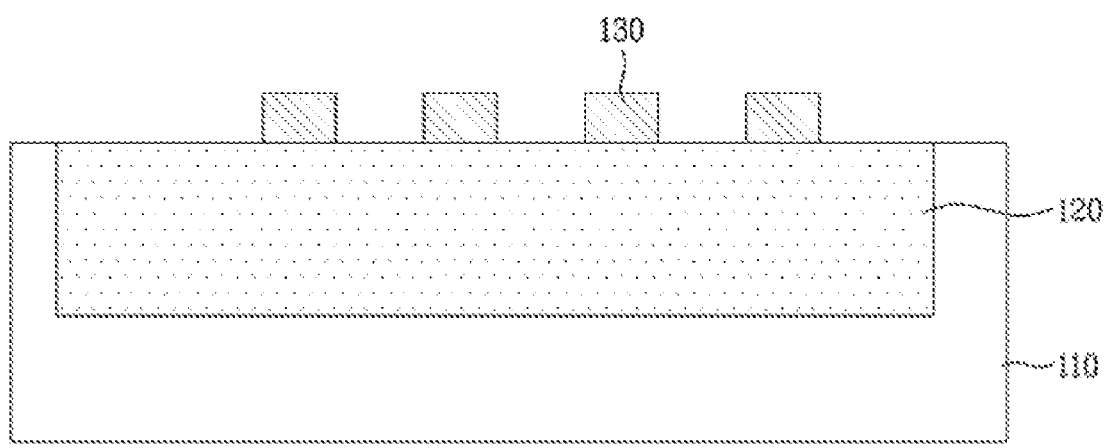
FIG. 2 is a cross-sectional view of the bipolar junction transistor shown in FIG. 1 along A-A' line.
Figure 3:
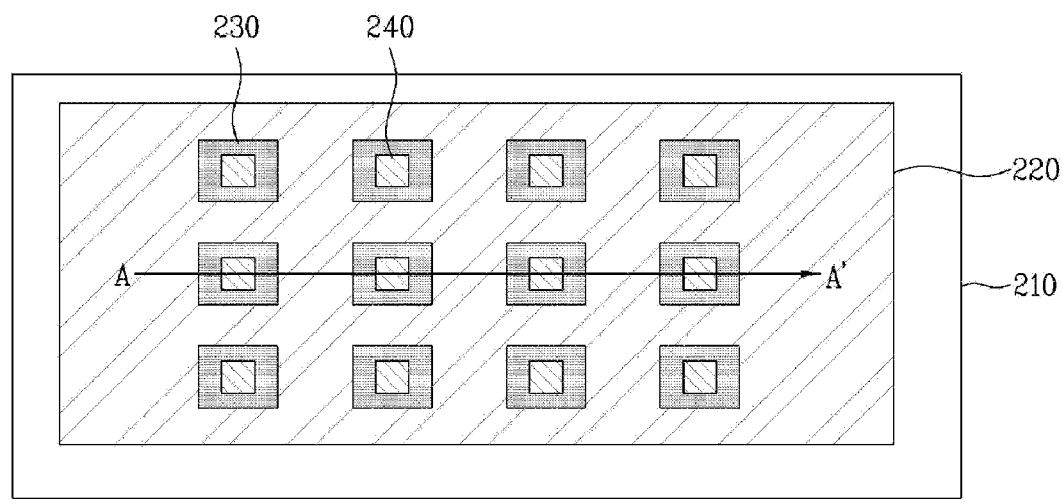
FIG. 3 is an overhead or layout view of a bipolar junction transistor according to an exemplary embodiment of the present invention.
Figure 4:
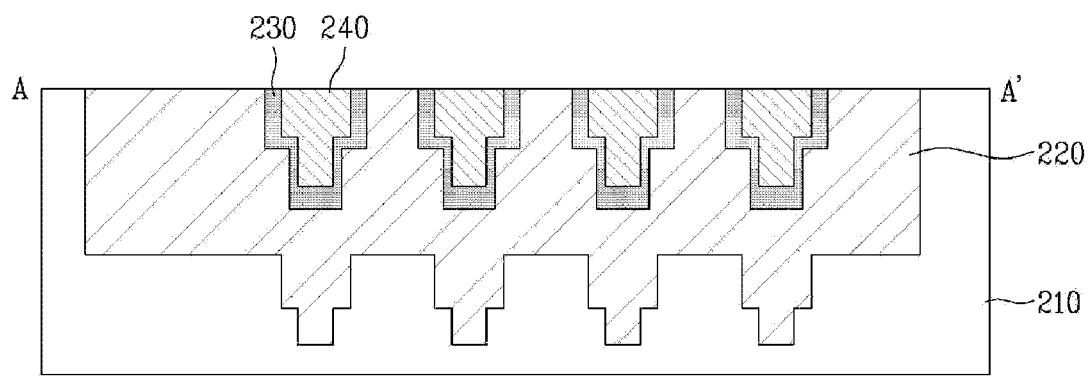
FIG. 4 is a cross-sectional view of the bipolar junction transistor shown in FIG. 3 along the A-A' line.

FIG. 3 is an overhead or layout view illustrating a bipolar junction transistor according to an exemplary embodiment of the present invention. FIG. 4 is a cross-sectional view of the bipolar junction transistor shown in FIG. 3 along the A-A' line.

The bipolar junction transistor (BJT) includes a first conductivity type substrate 210 (e.g., a single-crystal silicon wafer, or a single-crystal silicon wafer with one or more layers of epitaxial silicon grown thereon), a base region 220 formed in the substrate 210, a plurality of step-shaped recesses formed in the base region 220 at an upper surface of the substrate, step-shaped polysilicon layers 240 deposited in each of the step-shaped recesses (the polysilicon layers 240 have a complementary shape to the step-shaped recesses) and an emitter region 230 (which also has a step-like shape) between the polysilicon layers 240 and the base region 220.

A lower area of the base region 220 may also include step-shaped extensions which that extend downward into the substrate and that have a step-shaped pattern that corresponds to the step-shaped recesses at the upper surface of the substrate. The step-shaped extensions (which include first and second base extensions 530 and 545) of the base region 220 may have a shape that is substantially similar to the step-shaped recesses and a cross-sectional profile corresponding to the step-shaped recesses.

The emitter region 230 may also have a step-like shape, because it is formed between the step-shaped polysilicon layers 240 and the base region 220 by diffusing first type conductive impurity from the polysilicon layers 240. Because the junction region between the emitter region 230 and the base region 220 is step-shaped, a contact area between the emitter region 230 and the base region 220 may increase. In addition, the junction region between the base region 220 and a collector region 210 may also be step-shaped, and consequently, the contact area between the base region 220 and the collector region 210 can increase. Thus, as the junction areas (1) between the emitter region 230 and the base region 220, and (2) between the base region 220 and the collector region 210 increase, a reverse saturation current can be increased enough to increase a current gain of the BJT.

Figure 6:
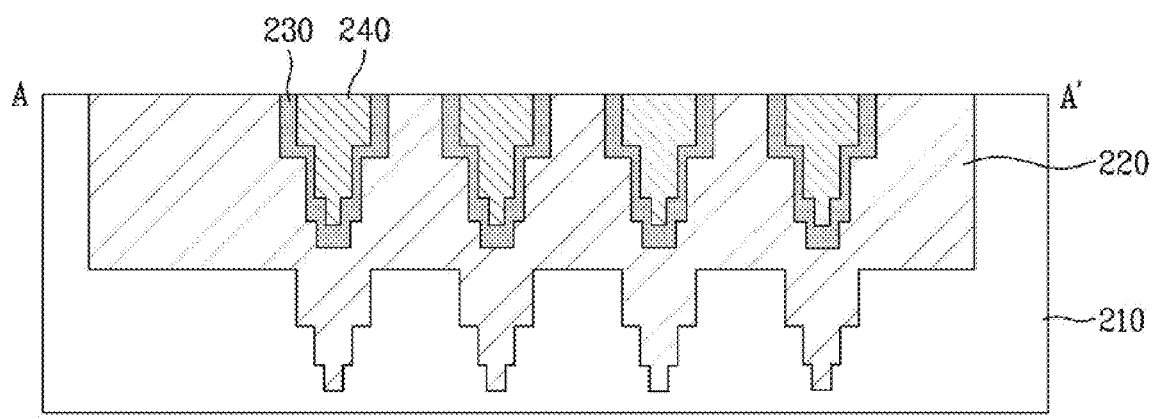
FIG. 6 is a cross-sectional view of a bipolar junction transistor according to an exemplary embodiment of the present invention having an emitter with a multi-step cross-sectional profile.

Although FIG. 4 shows only a single step in the shape of the step-shaped recesses and the step-shaped extensions, the BJT according to the present invention is not limited thereto. As shown in FIG. 6, a BJT having step-shaped recesses and step-shaped extensions having a multi-step shape may be formed using the presently disclosed methods.

FIGS. 5A to 5F are cross-sectional views illustrating structures formed in an exemplary method of manufacturing the bipolar junction transistor according to the present invention.

Figure 5A:
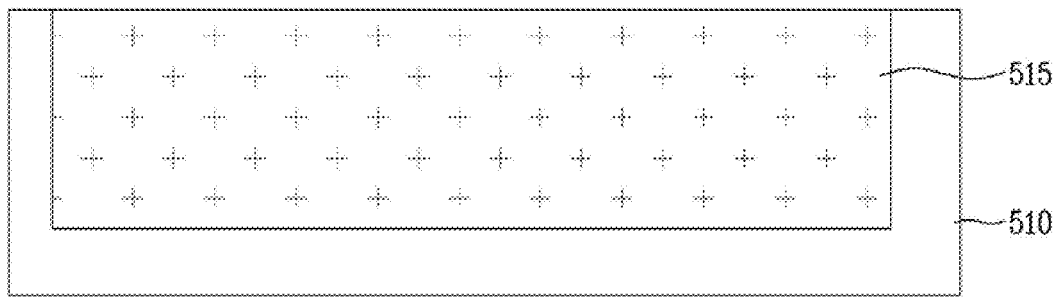
FIGS. 5A to 5F are cross-sectional views illustrating structures formed in an exemplary method of manufacturing a bipolar junction transistor according to exemplary embodiments of the present invention.

As shown in FIG. 5A, a first conductivity type substrate 510 (for example, an N-type substrate comprising a single crystal silicon wafer having P, As, and/or Sb dopant ions therein) is prepared and may function as a collector of the BJT. A second conductivity type impurity (for example, P-type impurity such as B or $BF_2$) is selectively implanted into the first conductivity type substrate 510 and to form a second conductivity type base 515.

For example, a photolithography process is performed and a first photoresist pattern (not shown) is formed by depositing a first photoresist layer (e.g., a negative or positive photoresist material) over the substrate 510 and photolithographically patterning the first photoresist layer to define the base region 515. Subsequently, the second conductivity type impurity is implanted into the substrate using the first photoresist pattern as an implantation mask to form the base region 515. The first photoresist pattern is then removed by asking or stripping.

Figure 5B:
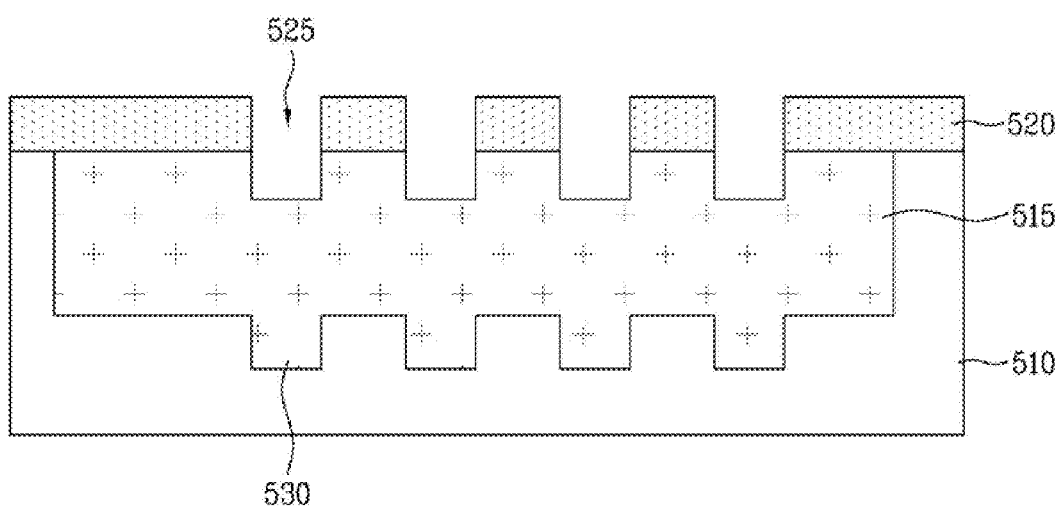

As shown in FIG. 5B, a second photoresist pattern 520 exposing one or more predetermined regions of the base region 515 is formed on the substrate 510. The second photoresist pattern 520 may be formed by depositing a second photoresist layer (e.g., a negative or positive photoresist material) over the substrate 510 and photolithographically patterning the second photoresist layer to expose predetermined portions of the base region 515. Then, the substrate 510 is etched in the base region 515 (e.g., by an anisotropic etching technique such as reactive ion etching [RIE]) using the second photoresist pattern 520 as mask to form first recesses 525.

Subsequently, second conductivity type impurity is implanted into the first recesses 525 in the substrate 510 at a high implantation energy using the second photoresist pattern 520 as mask to form first base extensions 530 that extend the lower area of the base region 515 under the first recesses 525 deeper into the substrate 510. The widths of the first base extensions 530 correspond to the first recesses 525. Alternatively, the recesses can be formed first, then the second conductivity type impurity can be implanted into the substrate using the mask described with reference to FIG. 5A.

Figure 5C:
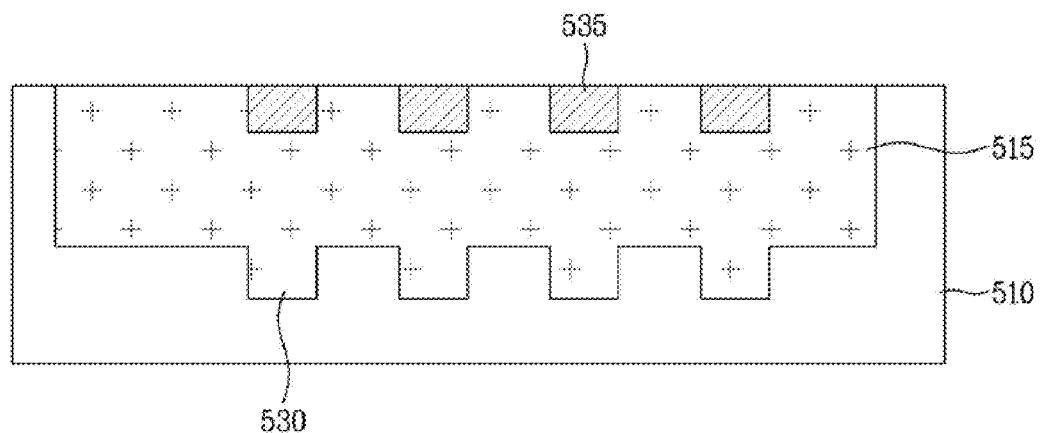

Thereafter, as shown in FIG. 5C, the second photoresist pattern is removed in an asking or stripping process. After that, a first polysilicon layer 535 is deposited over the substrate and in the first recesses 525. The first polysilicon layer 535 may be blanket deposited (e.g., by chemical vapor deposition [CVD], such as low pressure CVD [LPCVD], plasma enhanced CVD [PECVD], or atmospheric pressure CVD [APCVD]). The deposited first polysilicon layer 535 is then planarized in a chemical mechanical polishing (CMP) process. The CMP process results in multiple first polysilicon layers 535, each of the multiple polysilicon layers 535 filling one of the first recesses 525.

The first polysilicon layer 535 is highly doped with a first conductivity type impurity (e.g., N-type impurity such as P, As, and/or Sb). A highly doped polysilicon is used because it is preferable that the resistance between the polysilicon layer 535 and a subsequently formed emitter (e.g., 550 in FIG. 5F) is reduced, and the impurity in the polysilicon layer 535 can be uniformly diffused in a subsequent thermal treatment to form an emitter.

Figure 5D:
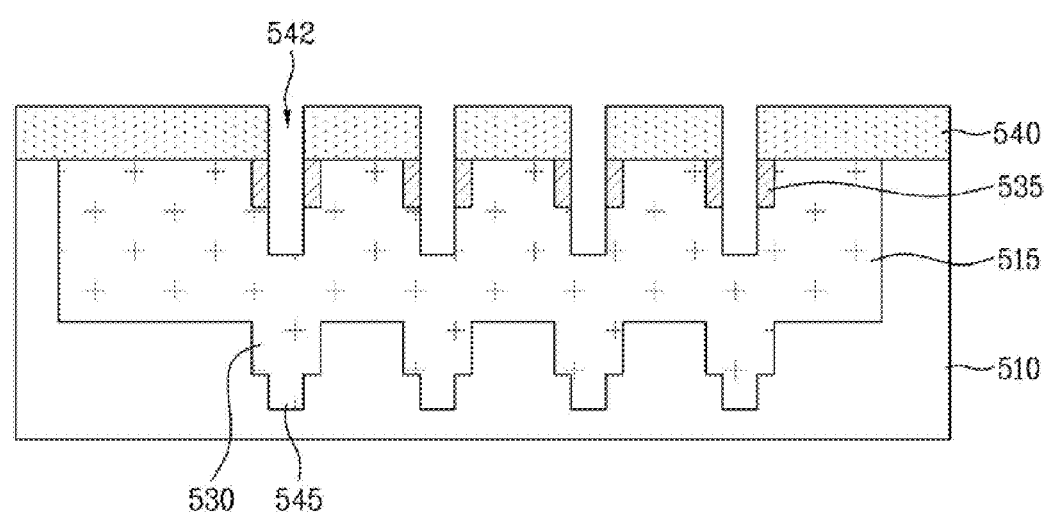

Thereafter, as shown in FIG. 5D, a third photoresist pattern 540 is formed on the planarized substrate 510. The third photoresist pattern 540 may be formed by depositing a third photoresist layer (e.g., a negative or positive photoresist material) over the substrate 510 and the polysilicon layer 535 and photolithographically patterning the third photoresist layer. Here, the third photoresist pattern 540 may be patterned to expose predetermined areas of the first polysilicon layers 535 in the first recesses 525. Openings in the third photoresist pattern 540 exposing the predetermined areas of the first polysilicon layers 535 may be substantially narrower than openings of the second photoresist pattern 520. Thus, only a portion of each first polysilicon layer 535 is exposed through the openings in the third photoresist pattern 540.

The exposed portions of the first polysilicon layers 535 and portions of the substrate 510 underneath the predetermined areas of the first polysilicon layers 535 are etched (e.g., by an anisotropic etching technique such as RIE) using the third photoresist pattern 540 as mask to form second recesses 542. Here, the widths of the second recesses are substantially smaller than the widths of the first recesses 525.

The second recesses 542 may pass through the entire thickness of the first polysilicon layer 535 and penetrate into the base region 515 of the substrate. However, the second recesses 542 do not pass through the entire thickness of the base region 515.

To adjust a breakdown voltage of the BJT, second conductivity type impurity ions (e.g., P-type ions such as B and/or $BF_2$) are implanted into the second recesses 542 in the substrate 510 at a high implantation energy using the third photoresist pattern 540 as mask to form second base extensions 545. The second base extensions 545 extend the lower area of the base 515 under the second recesses 542 deeper into the substrate 510. The widths of the second base extensions 545 correspond to the widths of the second recesses 542. The combination of the first base extensions 530 and the second base extensions 545 form based extensions that have a step-like cross-sectional profile. The step-like extensions increase a contact area between the base 515 and the collector 510.

Figure 5E:
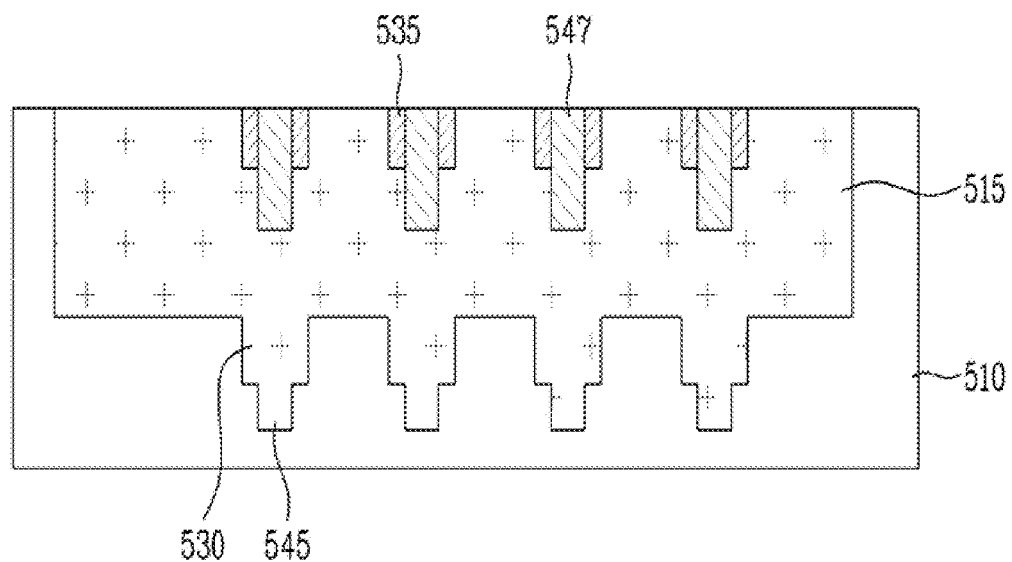

As shown in FIG. 5E, the third photoresist pattern 540 is removed by asking or stripping. Then, a second polysilicon layer 547 may be blanket deposited (e.g., by LPCVD, PECVD, or APCVD) to fill the second recesses 542. The deposited second polysilicon layer 547 is then planarized by a CMP process. The CMP process results in multiple second polysilicon layers 547, each of the multiple second polysilicon layers 547 filling one of the second recesses 542. The combination of the first polysilicon layers 535 and second polysilicon layers 547 form step-shaped polysilicon layers (see, e.g., polysilicon layers 240 in FIG. 4).

Figure 5F:
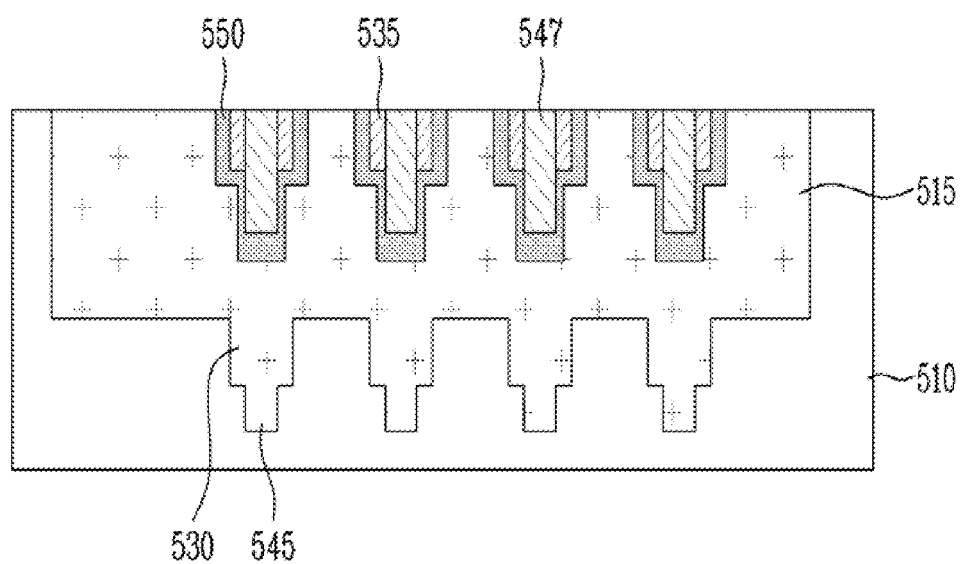

Here, the second polysilicon layers 547 are highly doped with a first conductivity type impurity (e.g., N-type impurity, such as P, As, and/or Sb). As shown in FIG. 5F, a thermal process is performed to diffuse the impurity ions in the first and second polysilicon layers 535 and 547 into a predetermined area of the base 515 adjacent to the first and second polysilicon layers 535 and 547 to form a first conductivity type (e.g., N-type) emitter 550.

Although FIGS. 4 and 5F show only a single step in the shape of the step-shaped recesses and the step-shaped extensions, the BJT according to the present invention is not limited thereto. As shown in FIG. 6, a BJT having step-shaped recesses and step-shaped extensions having multi-step shapes may be formed using the presently disclosed methods. For example, a fourth photoresist pattern defining third recesses may be formed over the substrate, and third recesses may be formed by etching the second 547 polysilicon layers. Subsequently, a second conductivity type impurity may be implanted into the third recesses at a high implantation energy using the fourth photoresist pattern as a mask to form third base extensions below the third recesses. A third polysilicon layer highly doped with first conductive type impurity may then be deposited in the third recesses and planarized by CMP, resulting in a structure as shown in FIG. 6. The process described above may be repeated to form further recesses and base extension for multi-step emitters and base extensions.

As a result of the step-shaped polysilicon layers and the corresponding step-like shape of the emitter 550, the area of the junction region between the emitter 550 and the base 515 is increased and the reverse saturation current may be increased. In addition, the step-shaped extensions of the base 515 maintain a uniform distance between the emitter and the collector, such that the breakdown voltage may be uniformly adjustable.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method of manufacturing a bipolar junction transistor comprising:
   implanting an impurity into a first conductivity type substrate to form a base region, the impurity and the base region having a second conductivity type;
   etching the substrate in the base region to form step-shaped recesses;
   forming a polysilicon layer doped with an impurity of the first conductivity type in the step-shaped recesses; and
   forming a step-shaped emitter adjacent to the polysilicon layer by diffusing the impurity from the polysilicon layer into the adjacent base region.

2. The method of claim 1, wherein the first conductivity type substrate comprises a collector.

3. The method of claim 1, wherein the second recesses pass through an entire thickness of the first polysilicon layer.

4. The method of claim 3, wherein the second recesses do not pass through an entire thickness of the base region.

5. The method of claim 1, wherein forming the polysilicon layer comprises:
   forming a first photoresist pattern to expose predetermined areas of the base region and etching the exposed predetermined areas of the base region using the first photoresist pattern as mask to form first recesses;
   removing the first photoresist pattern;
   depositing a first polysilicon layer doped with the impurity of the first conductivity type in the first recesses;
   planarizing the first polysilicon layer;
   forming a second photoresist pattern to expose a predetermined area of the first polysilicon layer;
   etching the predetermined area of the first polysilicon using the second photoresist pattern as mask to form second recesses;
   removing the second photoresist pattern; and
   depositing a second polysilicon layer doped with the impurity of the first conductivity type in the second recesses.

6. The method of claim 5, wherein the second recesses are substantially narrower than the first recesses.

7. The method of claim 5, further comprising implanting an impurity of the second conductivity type into the substrate through the first recesses using the first photoresist pattern as mask to form first base extensions.

8. The method of claim 7, further comprising implanting an impurity of the second conductivity type into the substrate through the second recesses using the second photoresist pattern as a mask to form second base extensions.

9. The method of claim 5, further comprising planarizing the second polysilicon layer.

10. The method of claim 9, further comprising:
    forming a third photoresist pattern to expose a predetermined area of the second polysilicon layer;
    etching the predetermined area of the second polysilicon layer using the third photoresist pattern as mask to form third recesses;
    removing the third photoresist pattern; and
    depositing a third polysilicon layer doped with the impurity of the first conductivity type in the third recesses.

11. The method of claim 9, wherein the third recesses pass through an entire thickness of the second polysilicon layer.

12. The method of claim 9, wherein the second recesses do not pass through an entire thickness of the base region.

13. The method of claim 9, further comprising implanting an impurity of the second conductivity type into the substrate through the third recesses using the third photoresist pattern as a mask to form third base extensions.

14. The method of claim 9, wherein the second recesses are substantially narrower than the first recesses.

15. The method of claim 14, wherein the second recesses pass through an entire thickness of the first polysilicon layer.

16. The method of claim 15, wherein the first conductivity type substrate comprises a collector.

17. The method of claim 9, wherein the second recesses pass through an entire thickness of the first polysilicon layer.

18. The method of claim 17, wherein the first conductivity type substrate comprises a collector.

19. The method of claim 9, wherein the first conductivity type substrate comprises a collector.

* * * * *